(12) United States Patent
Rayford, II et al.

(10) Patent No.: US 11,581,481 B2
(45) Date of Patent: Feb. 14, 2023

(54) OPTICAL SURFACE CLEANING WITH DIRECTED ENERGY WAVES

(71) Applicant: Continental Automotive Systems, Inc., Auburn Hills, MI (US)

(72) Inventors: Cleveland E Rayford, II, Camarillo, CA (US); Paul Vranjes, Santa Barbara, CA (US)

(73) Assignee: Continental Autonomous Mobility US, LLC, Auburn Hills, MI (US)

( * ) Notice: Subject to any disclaimer, the term of this patent is extended or adjusted under 35 U.S.C. 154(b) by 62 days.

(21) Appl. No.: 16/788,584

(22) Filed: Feb. 12, 2020

(65) Prior Publication Data

US 2021/0249586 A1 Aug. 12, 2021

(51) Int. Cl.
| | |
|---|---|
| *H01L 41/09* | (2006.01) |
| *B60S 1/56* | (2006.01) |
| *G02B 27/00* | (2006.01) |
| *H04R 1/02* | (2006.01) |

(52) U.S. Cl.
CPC ............ *H01L 41/0913* (2013.01); *B60S 1/56* (2013.01); *G02B 27/0006* (2013.01); *H04R 1/028* (2013.01)

(58) Field of Classification Search
CPC .......... H01L 41/0913; B60S 1/56; B60S 1/52; B60S 1/02; B60S 1/023; B60S 1/0818; B60S 1/54; G02B 27/006; H04R 1/028; B08B 7/028; B60B 1/0215
USPC ...................................................... 15/250.1
See application file for complete search history.

(56) References Cited

U.S. PATENT DOCUMENTS

| | | | |
|---|---|---|---|
| 3,171,683 | A | 3/1965 | Ludwig |
| 4,768,256 | A | 9/1988 | Motoda |
| 5,266,873 | A | 11/1993 | Arditi et al. |
| 8,899,761 | B2 | 12/2014 | Tonar et al. |
| 9,316,436 | B2 | 4/2016 | Trevett et al. |
| 9,925,570 | B2 | 3/2018 | Ji et al. |
| 2012/0243093 | A1 | 9/2012 | Tonar et al. |
| 2013/0298419 | A1 | 11/2013 | Trevett et al. |
| 2016/0266379 | A1* | 9/2016 | Li ....................... H04N 5/2171 |
| 2018/0009418 | A1* | 1/2018 | Newman ................ B60S 1/485 |
| 2018/0284268 | A1 | 10/2018 | McWhirter |
| 2018/0309043 | A1 | 10/2018 | Kobrin et al. |

(Continued)

FOREIGN PATENT DOCUMENTS

| | | |
|---|---|---|
| CN | 103978952 A | 8/2014 |
| DE | 102011107871 A1 | 1/2013 |

(Continued)

OTHER PUBLICATIONS

International Search Report and the Written Opinion of the International Searching Authority dated May 17, 2021 for the counterpart PCT Application No. PCT/US2021/070149.

(Continued)

*Primary Examiner* — Katina N. Henson

(57) ABSTRACT

A vehicle sensor assembly includes an optical sensor surface, at least two transducers arranged to input energy into the optical surface to produce an energy wave through the optical sensor surface and sense an attribute of an energy wave within the optical sensor surface. A controller arranged to drive the at least two transducers to input energy into the optical surface to produce an energy wave within the optical sensor surface to dislodge debris from the optical sensor surface.

7 Claims, 5 Drawing Sheets

(56) References Cited

U.S. PATENT DOCUMENTS

2019/0315316 A1 10/2019 Bretagnol et al.
2019/0351873 A1 11/2019 Dalal
2020/0377058 A1 12/2020 Ward

FOREIGN PATENT DOCUMENTS

DE  102018100805 A1  7/2019
JP  H08140898 A      6/1996
WO  2018094373 A1   5/2018

OTHER PUBLICATIONS

"Innovasonic and Spike Aerospace Announce Agreement to Explore Ultrasonic Self-Cleaning Technology for the Aerospace Market, Spike Aerospace," pp. 1-6, https://www.spikeaerospace.com/innovasonic-and-spike-aerospace-announce-agreement-to-explore-ultrasonic-self-cleaning-technology-for-the-aerospace-market/ No Date.
Innovasonic, http://www.innovasonic.com/#application No Date.
The Engineer, "Say Goodbye to Windscreen Wipers Thanks to Mclaren," Wonderful Engineering, Dec. 25, 2013, pp. 1-7.
Dron, Will, "McLaren Waves Goodbye to Windscreen Wipers with Ultrasonic Tech," Sunday Times Driving Limited, Dec. 17, 2013, pp. 1-11.
"McLaren's ultrasonic force field to replace windshield wipers," New Atlas, Dec. 24, 2013, pp. 1-11.

* cited by examiner

OPTICAL SURFACE CLEANING WITH DIRECTED ENERGY WAVES

TECHNICAL FIELD

The present disclosure relates to a method and system for cleaning of vehicle sensors.

BACKGROUND

Vehicles are increasingly implementing sensors for obtaining data utilized to adapt vehicle operations to a surrounding environment. Sensors can include RADAR, LIDAR and cameras. Commonly utilized sensors have an optical surface that provides input into the sensor. Debris on the sensor optical surface may impact sensor performance Conventional washing systems can require that large amounts of fluid be stored within the vehicle. Moreover, such fluid based systems are not operable if the fluid reserve is emptied. Cleaning with systems that utilize compressed air require costly additional devices within a vehicle and may not provide effective debris removal.

The background description provided herein is for the purpose of generally presenting a context of this disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A vehicle sensor assembly according to a disclosed example embodiment includes, among other possible things, an optical sensor surface, at least two transducers arranged to input energy into the optical surface to produce an energy wave through the optical sensor surface and sense at least one attribute of an energy wave within the optical sensor surface and a controller arranged to drive the at least two transducers to input energy into the optical surface to produce an energy wave within the optical sensor surface to dislodge debris from the optical sensor surface.

In another example embodiment of the foregoing vehicle sensor assembly, the optical sensor surface comprises a surface that is transparent to visible and/or non-visible light.

In another example embodiment of any of the foregoing vehicle sensor assemblies, the at least two transducers comprises a first transducer and a second transducer both configured to generate an energy wave in the optical sensor surface and sense the at least one attribute of the energy wave within the optical sensor surface.

In another example embodiment of any of the foregoing vehicle sensor assemblies, the first transducer and the second transducer comprise multiple transducers disposed within a periphery of the optical sensor surface.

In another example embodiment of any of the foregoing vehicle sensor assemblies, a memory device is in communication with the controller and contains data comprising a library of predefined attributes of the energy wave corresponding to a category of debris and the controller is configured to determine that debris is present on the optical sensor surface by comparing the at least one sensed attribute of the energy wave within the optical sensor surface with the predefined attributes of the energy wave and determine that debris is present based on the comparison meeting a predefined acceptance criteria.

In another example embodiment of any of the foregoing vehicle sensor assemblies, the controller is further configured to determine that an imperfection is present within the optical sensor surface based on the sensed at least one attribute of the energy wave.

In another example embodiment of any of the foregoing vehicle sensor assemblies, the controller is configured to determine a location of the debris on the optical sensor surface based on the sensed at least one attribute of the first energy wave.

In another example embodiment of any of the foregoing vehicle sensor assemblies, the controller is further configured to generate a first energy wave with the first transducer and a second energy wave with the second transducer to interfere with the first energy wave at the determined location of the debris.

In another example embodiment of any of the foregoing vehicle sensor assemblies, the controller is further configured to generate a first energy wave with the first transducer and a second energy wave with the second transducer to constructively interfere with the first energy wave.

In another example embodiment of any of the foregoing vehicle sensor assemblies, the optical sensor surface is part of one of a radar sensor, a LIDAR sensor or a camera.

In another example embodiment of any of the foregoing vehicle sensor assemblies, the at least two transducers comprises a piezo-electric transducers or a capacitive micro-machined transducers.

A method of cleaning an optical sensor surface according to another disclosed embodiment includes, among other possible things, generating a first energy wave within an optical sensor surface with a first transducer coupled to the optical sensor surface, sensing an attribute of the energy wave within the optical sensor surface with a second transducer coupled to the optical sensor surface, determining that debris is present on the optical sensor surface based on the sensed attribute of the energy wave, generating a second energy wave within the optical sensor surface with at least one of the first transducer and the second transducer in response to the detected debris and dislodging the debris from the optical sensor surface with an interference pattern produced by a combination of at least one of the first energy wave and the second energy wave.

In another example embodiment of the foregoing method of cleaning an optical sensor surface a controller contains a memory device containing data comprising a library of predefined attributes of the energy wave corresponding to a category of debris and determining that debris is present on the optical sensor surface further comprises comparing at least one sensed attribute of the energy wave within the optical sensor surface with the predefined attributes of the energy wave and determining that debris is present based on the comparison meeting a predefined acceptance criteria.

Another example embodiment of any of the foregoing methods of cleaning an optical sensor surface further comprises determining that an imperfection is present within the optical sensor surface based on the at least one sensed attribute of the first energy wave.

Another example embodiment of any of the foregoing methods of cleaning an optical sensor surface further comprises determining a location of the debris on the optical sensor surface based on the at least one sensed attribute of the first energy wave.

Another example embodiment of any of the foregoing methods of cleaning an optical sensor surface further comprises dislodging the debris from the optical sensor surface further comprises generating additional energy waves to constructively interfere at the determined location of the debris.

Another example embodiment of any of the foregoing methods of cleaning an optical sensor surface further comprises dislodging the debris from the optical sensor surface further comprises generating the additional energy waves to sweep across the optical sensor surface.

Another example embodiment of any of the foregoing methods of cleaning an optical sensor surface further comprises dislodging the debris from the optical sensor surface further comprises generating additional energy waves with one more additional transducers to constructively interfere with the first energy wave to generate a constructive interference in the optical sensor surface.

In another example embodiment of any of the foregoing methods of cleaning an optical sensor surface, the optical sensor surface is part of one of a radar sensor, a LIDAR sensor or a camera.

In another example embodiment of any of the foregoing methods of cleaning an optical sensor surface, the optical sensor surface comprises a surface that is transparent to visible and/or non-visible light.

In another example embodiment of any of the foregoing methods of cleaning an optical sensor surface, the first transducer and the second transducer comprise multiple transducers and all of the multiple transducers are disposed within a periphery of the optical sensor surface.

In another example embodiment of any of the foregoing methods of cleaning an optical sensor surface, the first transducer and the second transducer comprises one of a piezo-electric transducer or a capacitive micro-machined transducer.

Although the different examples have the specific components shown in the illustrations, embodiments of this disclosure are not limited to those particular combinations. It is possible to use some of the components or features from one of the examples in combination with features or components from another one of the examples.

These and other features disclosed herein can be best understood from the following specification and drawings, the following of which is a brief description.

DETAILED DESCRIPTION

Figure 1:
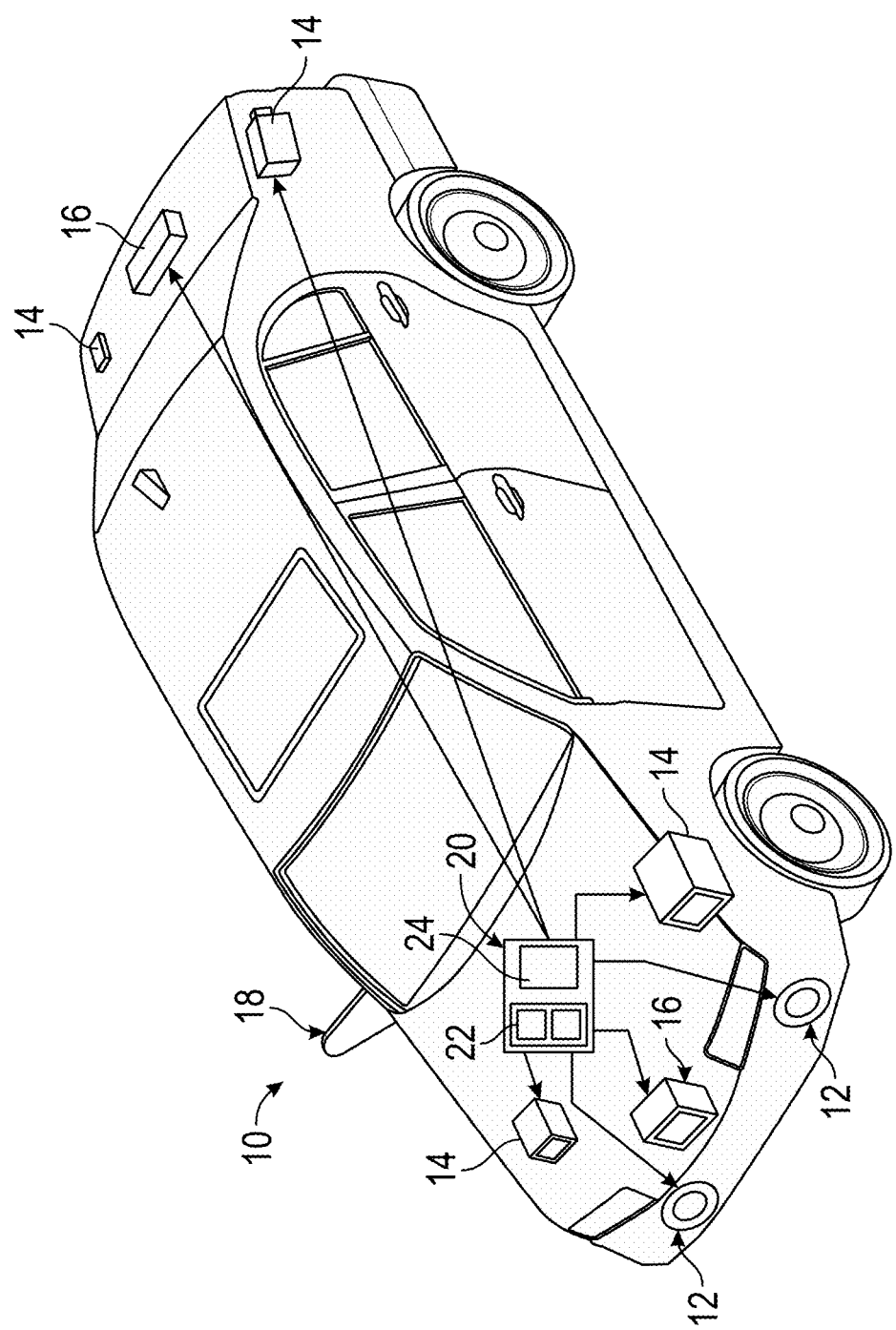
FIG. 1 is a schematic view of a vehicle with various sensors including an optical surface cleaning system.

Referring to FIG. 1, a vehicle 10 includes a plurality of different sensor assemblies for gathering data that is utilized for vehicle operation. The example sensor assemblies include a radar sensor 12, a LIDAR camera, and a camera 16. Although different sensors 12, 14 and 16 are disclosed by way of example, other sensors that include an optical surface would also benefit from this disclosure and are within the contemplation of this disclosure. A mirror 18 is further included on the vehicle 10.

A controller 20 communicates with the sensors 12, 14 and 16 to receive information utilized for operation of various vehicle systems. The example controller 20 includes a memory device 22 and a driver 24.

The example controller 20 relates to a device and system for performing necessary computing or calculation operations. The controller 20 may be specially constructed for this purpose, or it may comprise at least a general-purpose computer selectively activated or reconfigured by a computer program stored in the computer. The computing system can also consist of a network of (different) processors. Such a computer program and also data required for its execution may be stored in a computer readable storage medium, such as, but is not limited to, any type of disk including floppy disks, optical disks, CD-ROMs, magnetic-optical disks, read-only memories (ROMs), random access memories (RAMS), EPROMs, EEPROMs, magnetic or optical cards, application specific integrated circuits (ASICs), or any type of media suitable for storing electronic instructions, and each coupled to a computer system bus. Furthermore, the example controller 20 maybe a standalone controller 20 or may be part of an overall vehicle controller. Moreover, the controller 20 is functionally connected to the at least one of the sensor 12, 14 and 16.

The sensors 12, 14 and 16 are arranged about the vehicle 10 and are shown in various locations by example in FIG. 1. As appreciated, additional ones of each of the sensor 12, 14 and 16 may be present on the vehicle and provided in additional or different locations.

Figure 2:
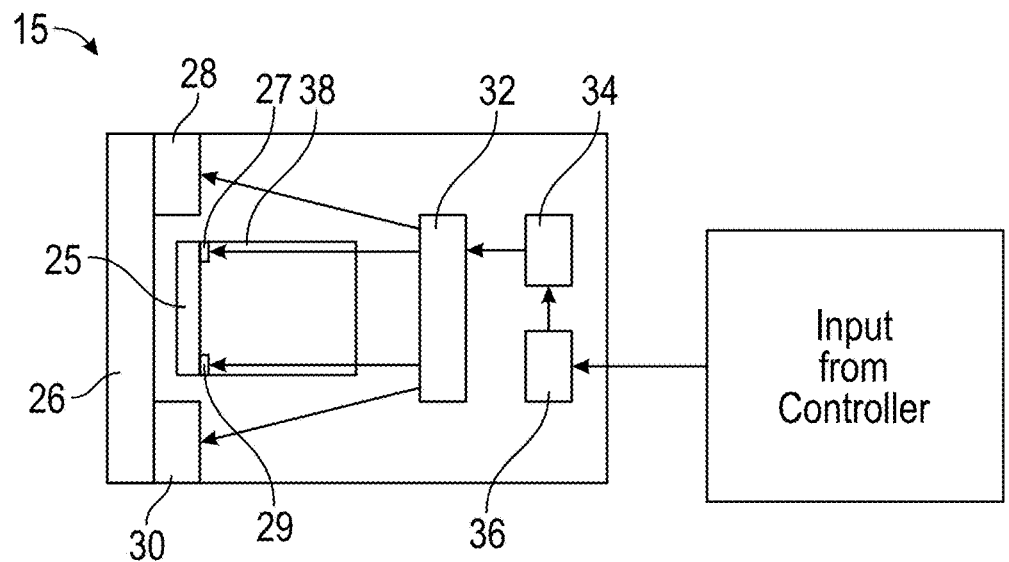
FIG. 2 is a schematic view of an example sensor assembly.

Referring to FIG. 2 with continued reference to FIG. 1, an example sensor assembly 15 is shown schematically. The example sensor assembly 15 may be any of the sensors 12, 14 and 16 and is shown as well as any other sensor assembly that includes an optical sensor surface. The sensor assembly includes an outer optical sensor surface 26, an inner optical sensor surface 25 and a sensing device 38. The structure of the sensing device 38 is dependent on the type of sensor 12, 14 and 16. The outer sensor surface 26 is exposed to the outside environment and the inner optical sensor surface is disposed within the sensor 12, 14 and 16.

A first transducer 28 and a second transducer 30 are disposed within the outer optical sensor surface 26. Transducers 27 and 29 are disposed within the inner optical sensor surface 25. Further features and operation of the disclosed device and system is described with respect to the outer optical sensor surface 26. The operation of the inner optical sensor surface 25 would also operate and include features that are described with regard to the outer optical sensor surface 26.

The transducers 28, 30 are configured to input an energy wave into the optical sensor surface 26 and detect attributes of the energy waves within the optical sensor surface 26. An energy wave transceiver 32 is coupled to each of the transducers 28, 30 for controlling energy input and communicating detected energy waves within the optical sensor surface 26. The energy wave transceiver 32 is coupled to a wave form generator 36 and a driver 34. Although a single energy wave transceiver 32, wave form generator 36 and driver 34 is depicted, additional transceivers 32, wave form generators 36 and drivers 34 may be provided for each of the transducers 28, 30. Moreover, although two transducers 28, 30 are depicted by way of example, any number of transducers 28, 30 may be utilized within the contemplation of this disclosure. Additionally, although one example embodiment involve transducers on only the outer surface, the disclosed cleaning system described herein can be applied equally to any number of internal optical surfaces, one example of which is illustrated as 25 with respective transducers 27 and 29.

The transducers 28, 30 operate to induce an energy wave within the optical sensor surface 26. The applied energy wave will correspond with the material and structural properties of the optical sensor surface 26. The optical sensor surface 26 is formed from a transparent material such as glass or plastic. The optical sensor surface 26 is transparent to light within the visible and/or non-visible light spectrum as appropriate for the type of sensor 12, 14 and 16. The transducers 28, 30 may be attached to a surface of the optical sensor surface 26 or embedded within a periphery of the optical sensor surface 26.

The wave generator 36 is controlled by input from the controller 20. The frequency, amplitude, power and direction of energy waves input into the optical sensor surface 26 generate sufficient energy and vibration to dislodge debris. The term debris as utilized in this disclosure is intended to include any solid or liquid matter that disrupts, blocks and/or distorts operation of the sensor assembly 15.

Figure 3:
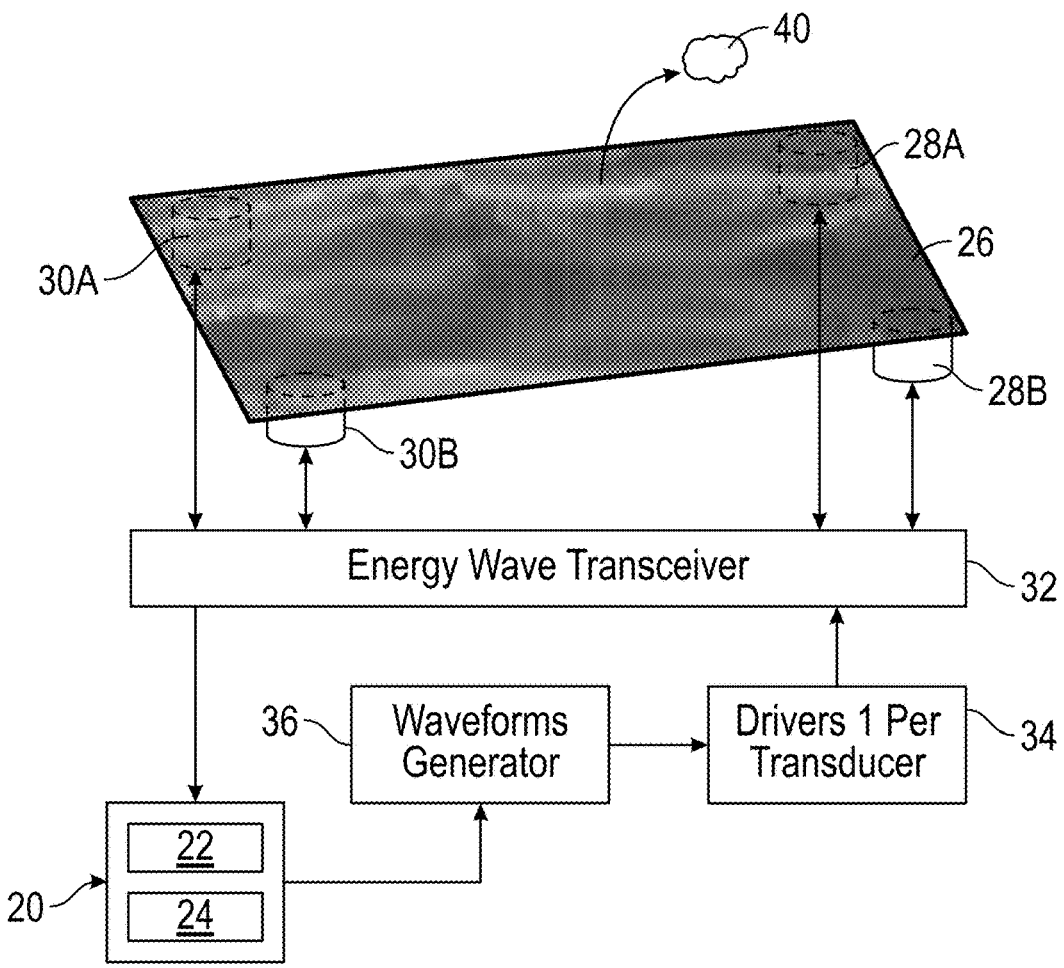
FIG. 3 is a schematic view of an example optical sensor surface cleaning system embodiment.

Referring to FIG. 3, a schematic view of the example optical sensor surface 26 is shown in operation. In this example, the four transducers 28A, 28B, 30A and 30B are disposed near each corner of the optical sensor surface 26. The transducers 28A, 28B, 30A and 30B generate a non-concentrated or scattered energy wave into the optical sensor surface 26 that dislodges debris 40. The energy input into the optical sensor surface 26 impart a physical force and vibrational movement that dislodges the debris 40.

The transducers 28A, 28B, 30A and 30B may be piezoelectric ultrasound transducers or capacitive micro-machined ultrasound transducers. Other transducers for generating an energy wave into the surface 26 may also be utilized within the contemplation and scope of this disclosure.

It should be appreciated, that the image of the surface is enlarged and exaggerated for disclosure purposes. Moreover, although a rectangular surface 26 is shown, the size and shape of the surface 26 will vary dependent on the sensor type and such different sizes and shapes are within the contemplation of this disclosure. Additionally, although the example optical sensor surface 26 is shown in a generally horizontal orientation, the optical sensor surface 26 may be more vertically orientated. In a more vertical orientation, once any adhesion between the debris and the surface 26 is disrupted, the debris will tend to slide and fall due to gravity. Moreover, a moving vehicle will generate surface airflow that will further drive the debris 40 from the surface 26 once any adhesion is disrupted.

Figure 4:
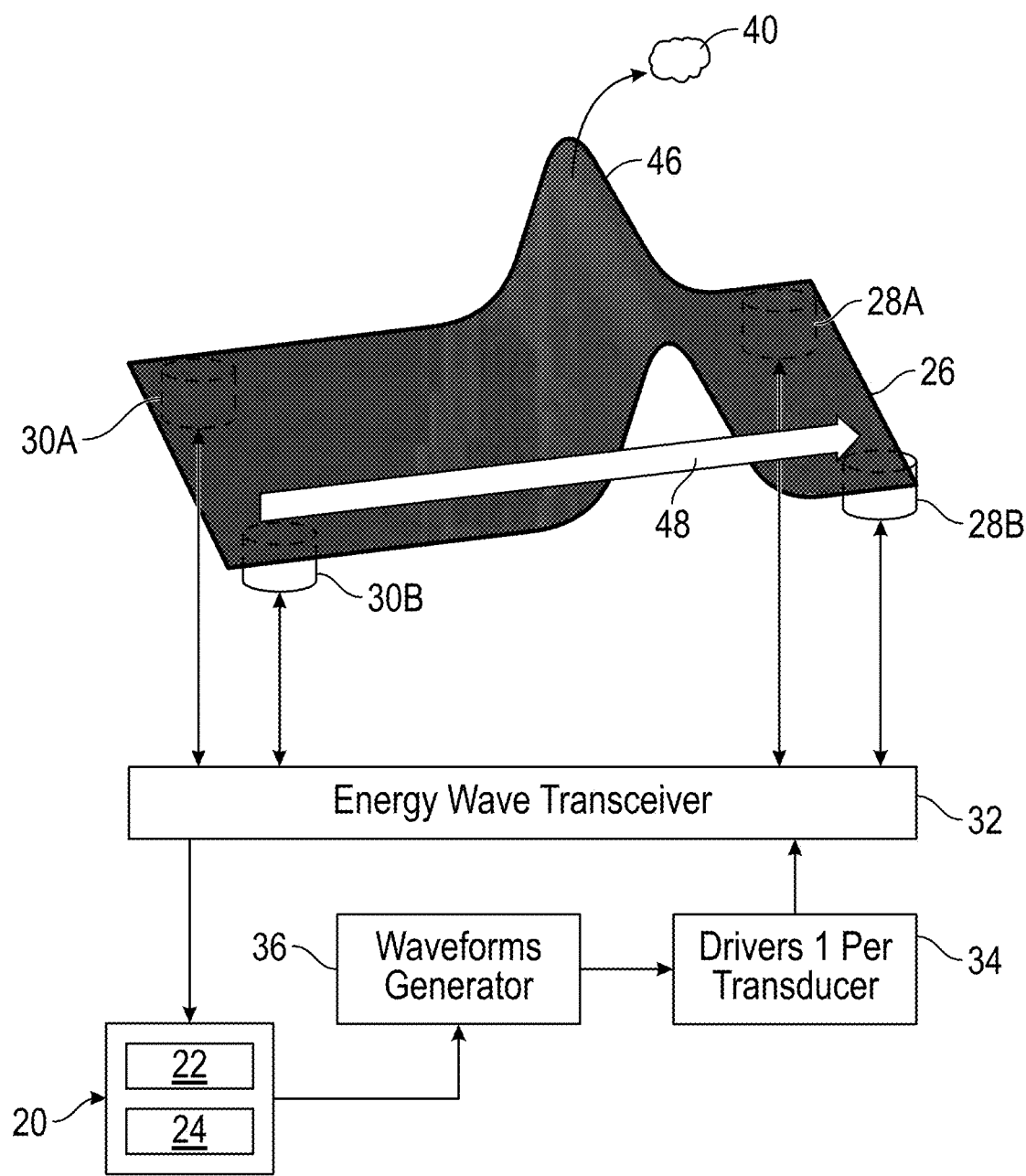
FIG. 4 is a view the example optical sensor surface cleaning system illustrating schematically a cleaning process.

Referring to FIG. 4, another schematic view of operation to clear the surface 26 is shown. The operation illustrated in FIG. 4 utilizes a directed energy wave 46 that sweeps across the surface 26 in a single direction indicated at 48. In this example, energy from the transducers 28A, 28B, 30A and 30B is timed and coordinated to sweep from one side of the surface 26 toward a second side. The sweeping motion of the energy wave 46 both dislodges the debris 40 and sweeps the debris from the surface 26. The directional energy wave 46 is repeated during operation to sweep debris 40 across and eventually off of the surface 26. The direction of the example energy wave 46 is along a single axis indicated by arrow 48. The direction of the energy wave 46 can be varied based on predefined factors such as, for example, the type of debris and/or location of the debris on the surface 26.

Figure 5:
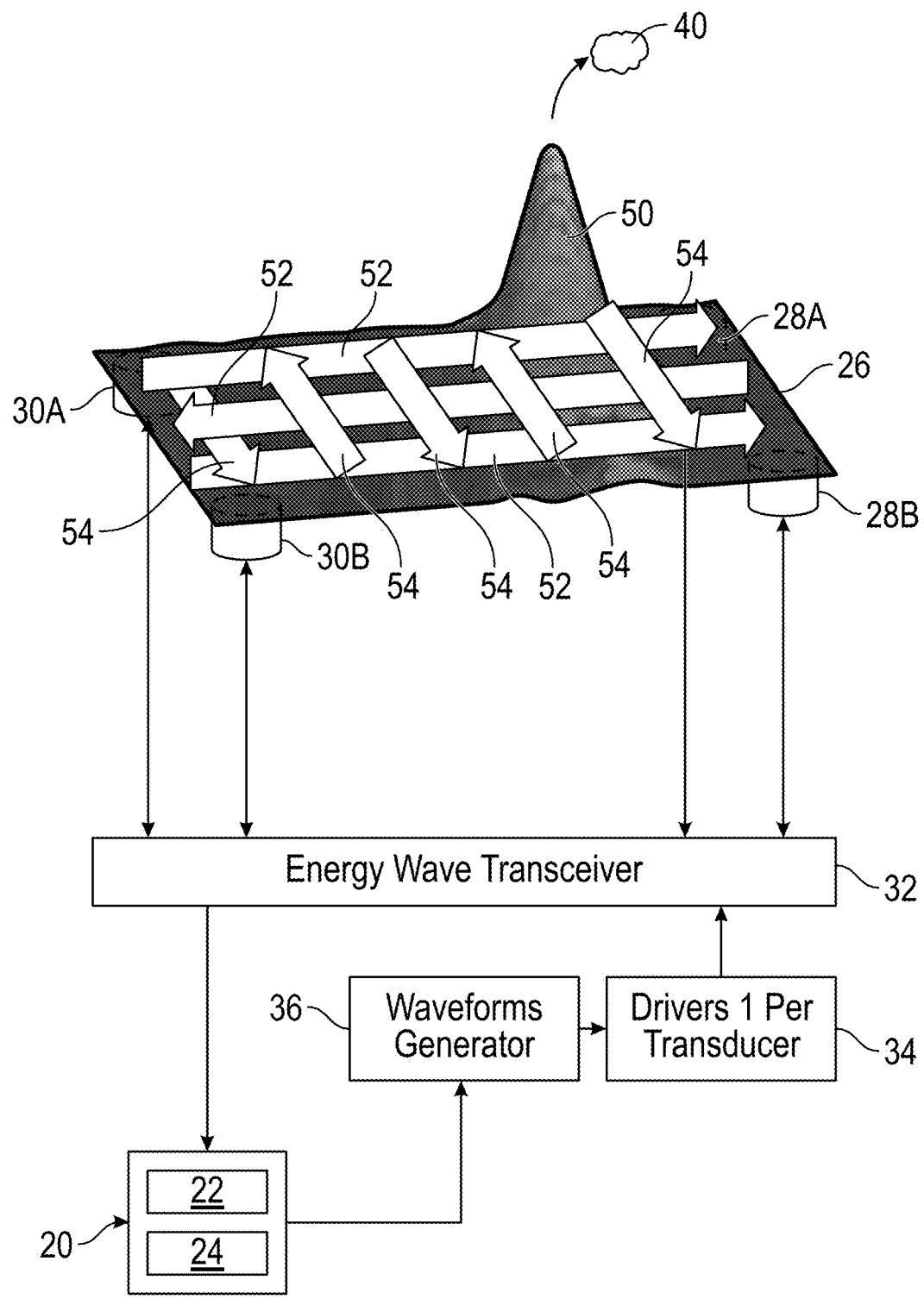
FIG. 5 is a view of the example optical sensor surface cleaning system illustrating schematically another cleaning process.

Referring to FIG. 5, another schematic view of operation to clear the surface 26 is shown. The operation illustrated in FIG. 5 generates a wave 50 from directed energy waves orientated along different axis as indicated by arrows 52 and 54. The disclosed directed energy waves 52, 54 are transverse to each other within the surface 26. The energy waves 52 and 54 converge at locations such that a constructive interference is generated to form a combined wave 50 that dislodges debris 40. In this example, the directed energy waves 52, 54 continually sweep across the surface each direction 52, 54 to clear debris 40.

Figure 6:
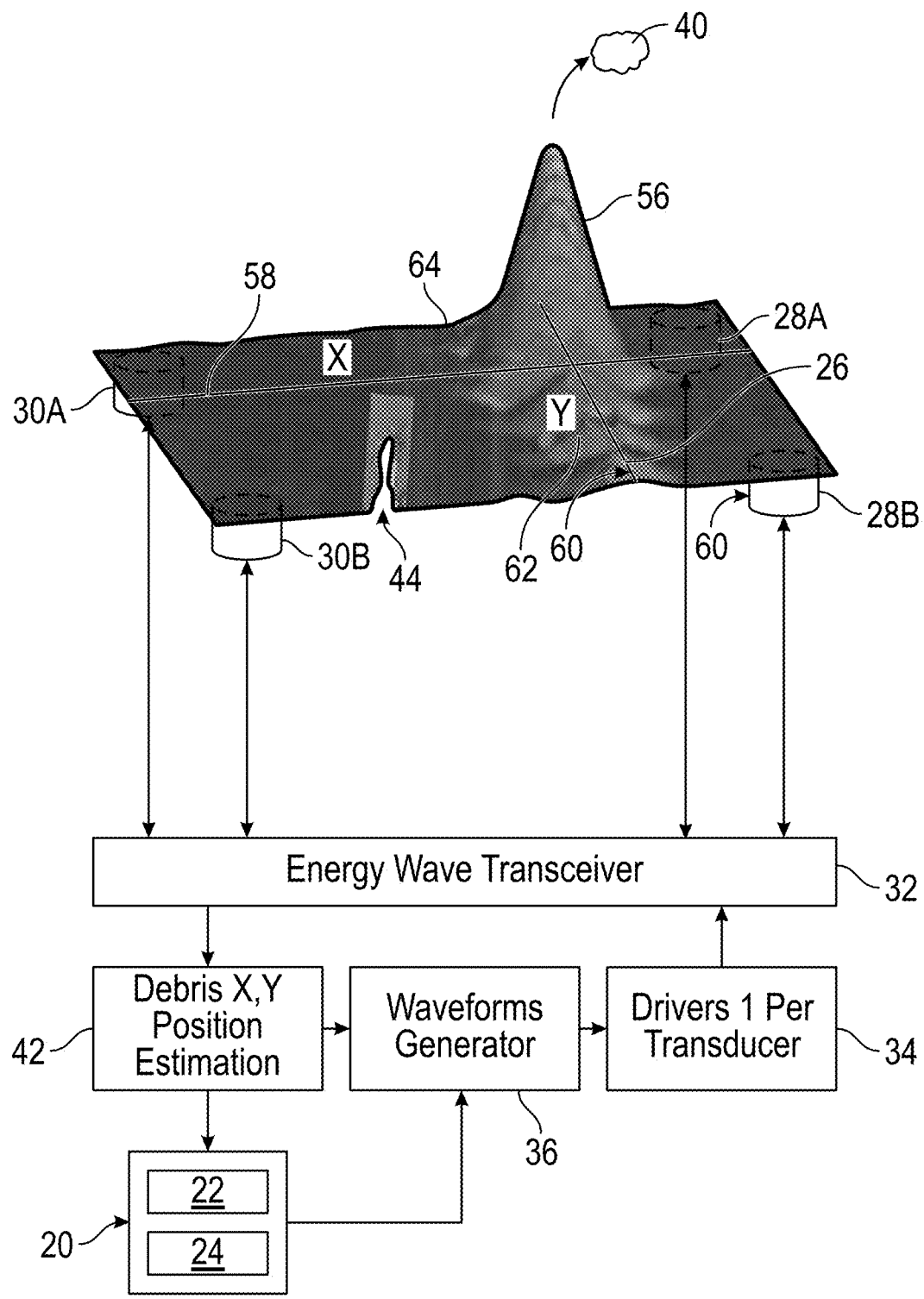
FIG. 6 is a view of the example optical sensor surface cleaning system illustrating schematically a targeted cleaning process.

Referring to FIG. 6, another schematic view of operation to clear the surface 26 is shown. The operation illustrated in FIG. 6 detects a position of the debris 40 on the surface 26 with a first energy wave and then targets the specific location of the detected debris with a second energy wave. The first wave illustrated at 64 is input by at least one of the transducers 28A, 28B, 30A and 30B, but not all of the transducers 28A, 28B, 30A and 30B. For example, in one disclosed operational embodiment, the first wave 64 is input by first transducers 28A and 28B. Second transducers 30A and 30B detect an attribute of the first energy wave 64. The detected attribute is analyzed to determine a position of the debris 40. The detected attribute may include a frequency, amplitude, phase and/or timing of the energy wave along with other recognized attributes of an energy wave.

The determination of a position is accomplished, in one example embodiment, by triangulating the energy wave based on a position of the first transducers 28A and 28B with a position estimating algorithm 42 that may be part of the sensor or the controller 20. Other means of translating the received attributes of the energy wave into a position of the debris 40 are within the scope and contemplation of this disclosure.

An algorithm or predetermined signature of the energy wave could be utilized within the contemplation of this disclosure. The predetermined signature is saved in the memory device 22 is used to determine the presence of and kind of debris 40 or crack 44 is on the optical surface 26. Each kind of debris 40 or crack has a specific signature that is produced when exposed to the input energy wave. The memory device 22 includes a library of specific attributes of the energy wave signatures and corresponding debris, defects and crack types. If a defect 44 is detected, the controller 20 would take remedial action with regard to that sensor because the cleaning system could not correct for such damage. The remedial action may include simply shutting off the sensor or may include adjustments that limit or correct for the sensor defect.

Once the kind of debris is identified, the controller 20 generates instructions to generate a targeted predefined energy wave 56. The targeted predefined energy wave 56 is unique to the identified debris 40 and focused to the location identified through the first wave 64. The targeted wave 56 is a combination of the first energy wave 64 along a first axis 58 and a second energy wave 62 along a second axis 60. The first wave 64 and the second wave 62 constructively interfere with each other. Additionally, energy waves are transmitted from the opposite direction along the same axes 58, 60. The area on the optical surface 26 where the constructive interference of the targeted energy wave 56 of the energy waves 64 and 62 occurs, is the location where the optical surface cleaning occurs.

The process is continually repeated until the surface 26 is cleaned. For example, detection and targeting continues throughout operation of the sensor. Once the surface 26 is clean, the detection wave is emitted to detect the presence of additional debris. The first detection wave 64 may be continuous or actuated after a predefined time.

Accordingly, the disclosed system and sensors include an optical surface that is cleaned by input energy waves that generate vibrations of the entire surface formed by any number of transducers. The input energy waves may sweep the entire surface, or target, localized cleaning of a specific area on the optical surface 26.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

Although an example embodiment has been disclosed, a worker of ordinary skill in this art would recognize that certain modifications would come within the scope of this disclosure. For that reason, the following claims should be studied to determine the scope and content of this disclosure.

What is claimed is:

1. A vehicle sensor assembly comprising:
   an optical sensor surface;
   a first transducer and a second transducer, each arranged to input energy into the optical surface to produce an energy wave through the optical sensor surface and sense at least one attribute of the energy wave within the optical sensor surface;
   a controller configured to determine a location of the debris on the optical sensor surface based on the sensed at least one attribute of the energy wave;
   wherein the controller is further configured to generate a first energy wave with the first transducer and a second energy wave with the second transducer to interfere with the first energy wave at the determined location of the debris to dislodge the debris; and
   a memory device in communication with the controller and containing data comprising a library of predefined attributes of the energy wave corresponding to a category of debris and the controller is configured to determine that debris is present on the optical sensor surface by comparing the at least one sensed attribute of the energy wave within the optical sensor surface with the predefined attributes of the energy wave and determine that debris is present based on the comparison meeting a predefined acceptance criteria.

2. The vehicle sensor assembly as recited in claim 1, wherein the optical sensor surface comprises a surface that is transparent to at least one of visible and non-visible light.

3. The vehicle sensor assembly as recited in claim 1, wherein the first transducer and the second transducer each comprise multiple transducers disposed within a periphery of the optical sensor surface.

4. The vehicle sensor assembly as recited in claim 3, wherein the controller is further configured to determine that an imperfection is present within the optical sensor surface based on the sensed at least one attribute of the energy wave.

5. The vehicle sensor assembly as recited in claim 4, wherein the controller is further configured to generate a first energy wave with the first transducer and a second energy wave with the second transducer to constructively interfere with the first energy wave.

6. The vehicle sensor assembly as recited in claim 1, wherein the optical sensor surface is part of one of a radar sensor, a LIDAR sensor or a camera.

7. The vehicle sensor assembly as recited in claim 1, wherein the at least two transducers comprises a piezoelectric transducers or a capacitive micro-machined transducers.

* * * * *